United States Patent
Jondu et al.

(10) Patent No.: US 11,238,724 B2
(45) Date of Patent: Feb. 1, 2022

(54) SYSTEMS AND METHODS FOR AUTOMATICALLY ACTIVATING SELF-TEST DEVICES OF SENSORS OF A SECURITY SYSTEM

(71) Applicant: Ademco Inc., Golden Valley, MN (US)

(72) Inventors: Lokanatha Reddy Jondu, Bangalore (IN); Kalpaga Kanakarajan, Bangalore (IN); Samidurai Krishnamoorthy, Thanjavur (IN)

(73) Assignee: Ademco Inc., Golden Valley, MN (US)

( * ) Notice: Subject to any disclaimer, the term of this patent is extended or adjusted under 35 U.S.C. 154(b) by 101 days.

(21) Appl. No.: 16/277,396

(22) Filed: Feb. 15, 2019

(65) Prior Publication Data
US 2020/0264685 A1    Aug. 20, 2020

(51) Int. Cl.
G08B 29/14    (2006.01)
G06F 1/3231   (2019.01)
G01R 31/392   (2019.01)
H01M 10/48    (2006.01)

(52) U.S. Cl.
CPC .......... *G08B 29/14* (2013.01); *G01R 31/392* (2019.01); *G06F 1/3231* (2013.01); *H01M 10/48* (2013.01)

(58) Field of Classification Search
CPC .... G01R 31/392; G06F 1/3231; H01M 10/48; G08B 15/008; G08B 25/008
See application file for complete search history.

(56) References Cited

U.S. PATENT DOCUMENTS

| | | | |
|---|---|---|---|
| 5,907,279 A | | 5/1999 | Bruins et al. |
| 6,081,197 A | * | 6/2000 | Garrick ................ G08B 29/181 340/636.1 |
| 7,054,414 B2 | | 5/2006 | Bergman et al. |
| 7,728,724 B1 | | 6/2010 | Scalisi et al. |
| 8,086,702 B2 | | 12/2011 | Baum et al. |
| 8,086,703 B2 | | 12/2011 | Baum et al. |

(Continued)

FOREIGN PATENT DOCUMENTS

| | | |
|---|---|---|
| CN | 101371241 A | 2/2009 |
| EP | 1713044 A2 | 10/2006 |
| EP | 3 298 598 | 3/2018 |

OTHER PUBLICATIONS

Bibliographic data for EP3298598 (A1), Abstract not available for EP3298598 (A1), Abstract of corresponding document: WO2016186791 (A1).

(Continued)

*Primary Examiner* — Bryce P Bonzo
*Assistant Examiner* — Michael Xu
(74) *Attorney, Agent, or Firm* — Fredrikson & Byron, P.A.

(57) ABSTRACT

Systems and methods for automatically activating self-test devices of sensors of a security system are provided. Such systems and methods can include a self-test monitoring device that can identify a test triggering event and, responsive thereto, activate the self-test devices of the sensors and determine whether each of the sensors passes or fails a respective self-test associated with its self-test devices. In some embodiments, when any of the sensors fails its respective self-test, the self-test monitoring device can identify one or more notification devices based on a type of the test triggering event and transmit a self-test failure report to the one or more notification devices.

14 Claims, 2 Drawing Sheets

(56) References Cited

U.S. PATENT DOCUMENTS

| | | | |
|---|---|---|---|
| 8,122,131 B2 | 2/2012 | Baum et al. | |
| 8,274,385 B2 | 9/2012 | Meier et al. | |
| 8,350,694 B1* | 1/2013 | Trundle | G08B 13/00 |
| | | | 340/539.11 |
| 8,456,278 B1 | 6/2013 | Bergman et al. | |
| 8,638,210 B2 | 1/2014 | Simon et al. | |
| 8,996,665 B2 | 3/2015 | Baum et al. | |
| 9,454,893 B1* | 9/2016 | Warren | G08B 17/10 |
| 9,495,861 B2 | 11/2016 | Eskildsen et al. | |
| 9,842,485 B2 | 12/2017 | Scaria et al. | |
| 2004/0012491 A1* | 1/2004 | Kulesz | G08B 21/12 |
| | | | 340/506 |
| 2009/0138958 A1 | 5/2009 | Baum et al. | |
| 2011/0001603 A1* | 1/2011 | Willis | H04L 9/3226 |
| | | | 340/5.2 |
| 2012/0084857 A1 | 4/2012 | Hubner et al. | |
| 2013/0009775 A1 | 1/2013 | Egawa | |
| 2014/0266678 A1* | 9/2014 | Shapiro | G08B 29/14 |
| | | | 340/514 |
| 2014/0282048 A1 | 9/2014 | Shapiro et al. | |
| 2014/0313032 A1 | 10/2014 | Sager et al. | |
| 2015/0029020 A1 | 1/2015 | Bailey et al. | |
| 2015/0160636 A1* | 6/2015 | McCarthy, III | H05B 47/19 |
| | | | 348/552 |
| 2015/0287310 A1* | 10/2015 | Deliuliis | G08B 21/10 |
| | | | 340/628 |
| 2015/0334087 A1 | 11/2015 | Dawes | |
| 2016/0043905 A1 | 2/2016 | Fiedler | |
| 2016/0049071 A1 | 2/2016 | Beaver et al. | |
| 2016/0078698 A1 | 3/2016 | Moses et al. | |
| 2016/0189496 A1 | 6/2016 | Modi et al. | |
| 2017/0061776 A1 | 3/2017 | Scaria et al. | |
| 2017/0223807 A1* | 8/2017 | Recker | H02J 13/0017 |
| 2018/0199179 A1* | 7/2018 | Rauner | G08B 25/10 |
| 2020/0074841 A1* | 3/2020 | Kazi | G08B 27/003 |

OTHER PUBLICATIONS

Espacenet Description: EP3298598 (A1).
Simplisafe's Owner's Manual, May 7, 2018.

* cited by examiner

SYSTEMS AND METHODS FOR AUTOMATICALLY ACTIVATING SELF-TEST DEVICES OF SENSORS OF A SECURITY SYSTEM

FIELD

The present invention relates generally to security systems. More particularly, the present invention relates to systems and methods for automatically activating self-test devices of sensors of a security system.

BACKGROUND

Known security systems can deploy various types of sensors, controllers, and gateways that can be battery-operated and include individual self-testing devices or features. However, these known security system devices require each of the self-testing devices to be manually activated at a respective one of the devices itself. Therefore, such known security system devices cannot automatically run all of the self-testing devices in response to a triggering event, such as a planned absence from a region monitored by one of the security systems or emergencies occurring proximate to the region.

In view of the above, there is a continuing, ongoing need for improved systems and methods.

DETAILED DESCRIPTION

Figure 1:
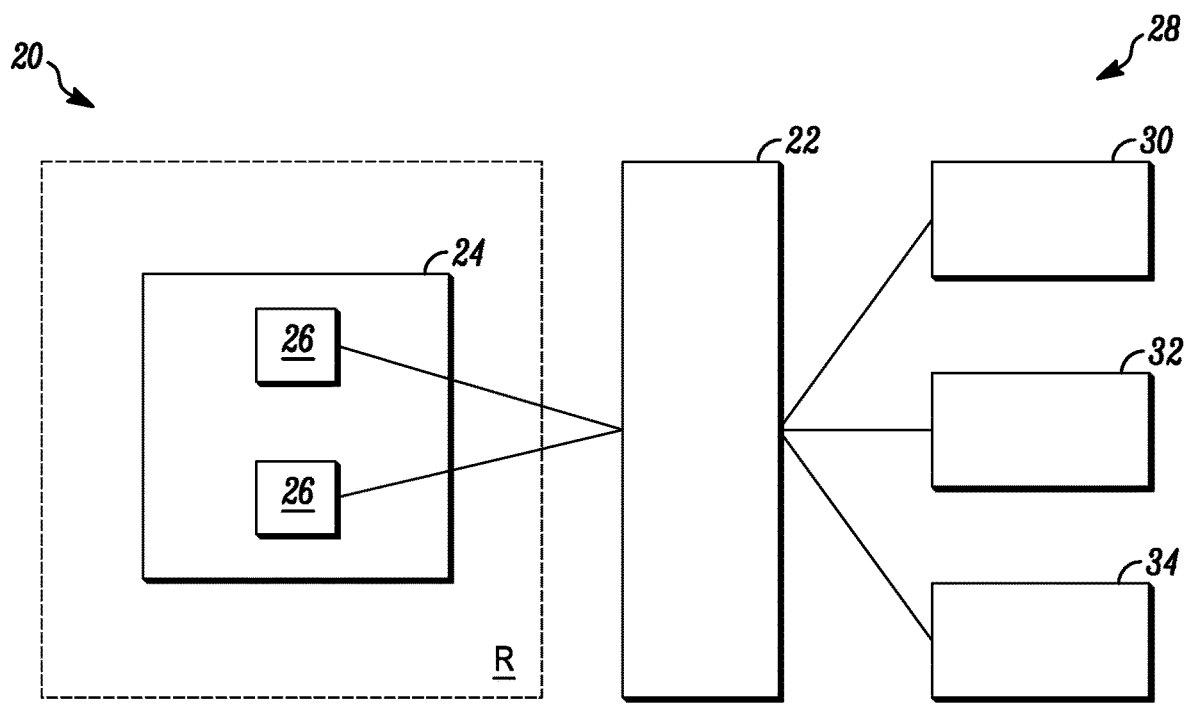
FIG. 1 is a block diagram of a system in accordance with disclosed embodiments.

While this invention is susceptible of an embodiment in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments disclosed herein can include systems and methods for automatically activating self-test devices of one or more sensors of a security system. Such systems and methods can include a self-test monitoring device, the one or more sensors, and one or more notification devices. In some embodiments, the self-test monitoring device can include or be part of a control panel or similar security system device local to a region monitored by the security system. Additionally or alternatively, in some embodiments, the self-test monitoring device can include or be part of a cloud server or device remote from the region. In some embodiments, the one or more sensors can include known security system devices, such as door or motion sensors that include integrated self-test devices.

The systems and methods disclosed herein can include the self-test monitoring device identifying a test triggering event and, responsive thereto, activating the self-test devices of the one or more sensors. For example, in some embodiments, systems and methods disclosed herein can activate the self-test devices of two of the one or more sensors such that a first of the one or more sensors has a different type than a second of the one or more sensors.

In any embodiment, the self-test monitoring device can determine whether each of the one or more sensors passes or fails a respective self-test associated with the self-test devices of that one of the one or more sensors. When any of the one or more sensors fails its respective self-test, the self-test monitoring device can identify the one or more notification devices based on a type of the test triggering event and transmit a self-test failure report to the one or more notification devices such that the self-test failure report can identify which of the one or more sensors failed its respective self-test. In some embodiments, systems and methods disclosed herein can transmit a self-test report for each of the one or more sensors that fails its respective self-test.

In some embodiments, the respective self-test of each of the one or more sensors can identify a remaining battery life of that one of the one or more sensors. Additionally or alternatively, in some embodiments, the respective self-test of each of the one or more sensors can determine whether that one of the one or more sensors is operable to detect threats in the region.

In some embodiments, the self-test monitoring device can receive user input identifying a preplanned absence of a user of the security system from the region. Responsive thereto, the self-test monitoring device can identify the user input as the test triggering event and determine the type of the test triggering event to be a non-emergency type. Additionally or alternatively, in some embodiments, the self-test monitoring device can identify an occurrence of a preprogrammed periodic time interval as the test triggering event and determine the type of the test triggering event to be the non-emergency type. When the self-test monitoring device identifies the type of the test triggering event to be the non-emergency type and when any of the one or more sensors fails its respective self-test, the self-test monitoring device can identify a user device associated with the user of the security system as the one or more notification devices.

In this regard, when the respective self-test of each of the one or more sensors identifies the remaining battery life of that one of the one or more sensors, the self-test monitoring device can identify a length of the preplanned absence from the user input and determine that any of the one or more sensors fails its respective self-test when the remaining battery life of that one of the one or more sensors is less than the length of the preplanned absence. In some embodiments, the self-test monitoring device can identify the remaining battery life of any of the one or more sensors that failed its respective self-test in the self-test failure report.

Additionally or alternatively, in some embodiments, the self-test monitoring device can receive a notification of a current emergency condition proximate to the region, can receive predictive data from third party sources and use the predictive data to make a prediction of a future emergency condition proximate to the region, or can directly or indirectly receive a notification of an alert condition from the one or more sensors. In some embodiments, the current or future emergency conditions proximate to the region can include an increase in crime in an area proximate to the region or can include a natural disaster, such as a weather emergency, in the area proximate to the region.

In any embodiment, responsive to the notification of the current emergency condition, the prediction of the future emergency condition, or the notification of the alert condition, the self-test monitoring device can identify the notification of the current emergency condition, the prediction of the future emergency condition, or the notification of the alert condition as the test triggering event and determine the type of the test triggering event to be an emergency type. When the self-test monitoring device identifies the type of the test triggering event to be the emergency type and when any of the one or more sensors fails its respective self-test, the self-test monitoring device can identify both the user device associated with the user of the security system and at least one third party device associated with local authorities or a system provider of the security system as the one or more notification devices.

Figure 2:
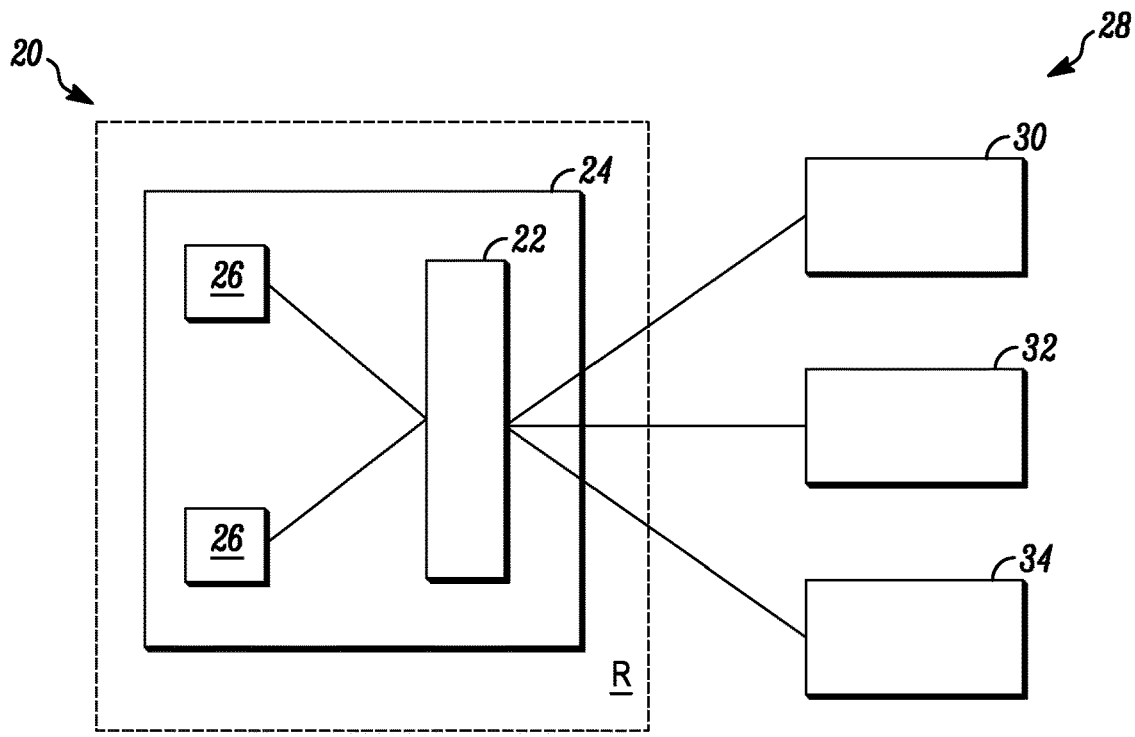
FIG. 2 is a block diagram of a system in accordance with disclosed embodiments.

FIG. 1 and FIG. 2 are block diagrams of a system 20 in accordance with disclosed embodiments. As seen in FIG. 1 and FIG. 2, the system 20 can include a self-test monitoring device 22, a security system 24 that monitors a region R, sensors 26 of the security system 24, and one or more notification devices 28. As seen in FIG. 1, in some embodiments, the self-test monitoring device 22 can be separate from the security system 24 and remote from the region R. For example, in some embodiments, the self-test monitoring device 22 can include or be part of a cloud server or device. However, as seen in FIG. 2, in some embodiments, the self-test monitoring device 22 can be integrated with the security system 24 and local to the region R. For example, in some embodiments, the self-test monitoring device 22 can include or be part of a control panel of the security system 24. In any embodiment, the one or more notification devices 28 can include a user device 30 associated with a user of the security system 24, a first third party device 32 associated with local authorities, and/or a second third party device 34 associated with a system provider of the security system 24, such as a central monitoring station.

Figure 3:
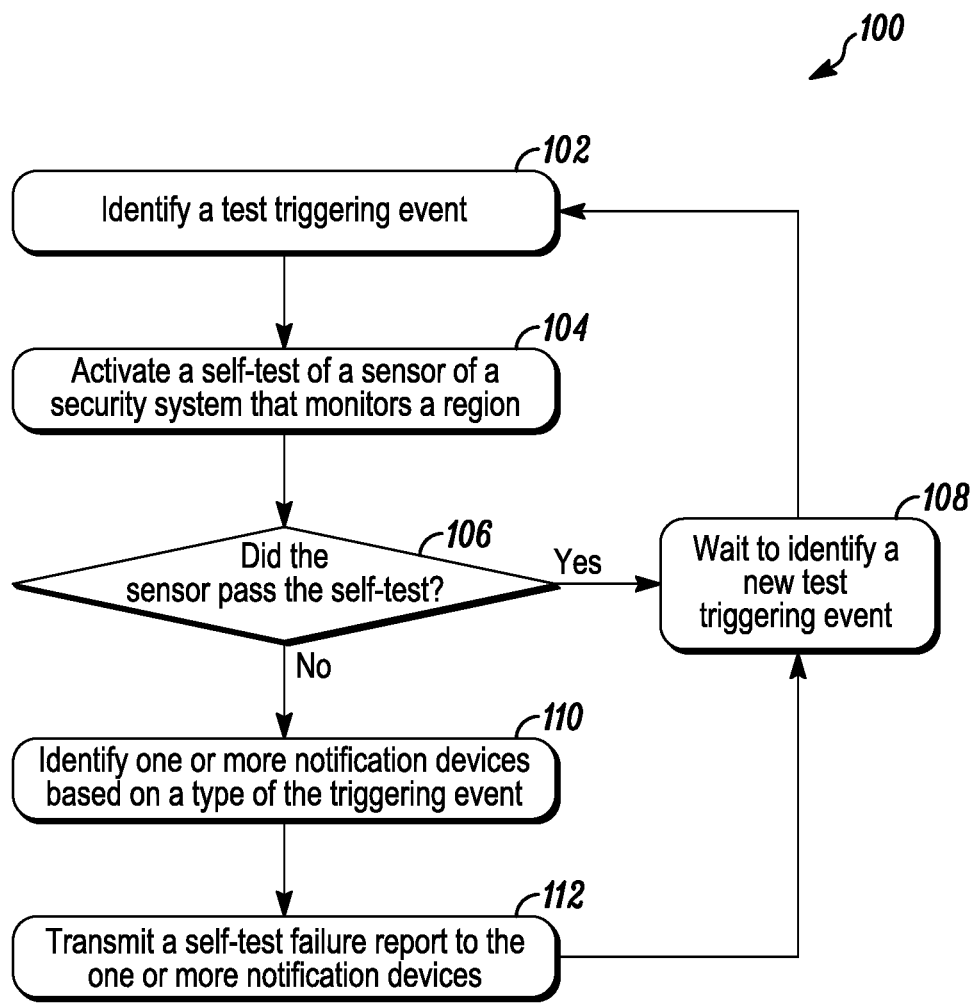
FIG. 3 is a flow diagram of a method in accordance with disclosed embodiments.

FIG. 3 is a flow diagram of a method 100 in accordance with disclosed embodiments. It is to be understood that, in some embodiments, the self-test monitoring device 22 can execute and control some or all of the method 100.

As seen in FIG. 3, the method 100 can include identifying a test triggering event associated with the region R, as in 102. Then, the method 100 can include activating a self-test device of one of the sensors 26 associated with the region R, as in 104, and determining whether the one of the sensors 26 passed or failed a self-test associated with the self-test device activated, as in 106. When the one of the sensor 26 passes the self-test, the method 100 can include waiting for another test triggering event, as in 108. However, when the one of the sensor 26 fails the self-test, the method 100 can include identifying at least one of the one or more of the notification devices 28 based on a type of the test triggering event, as in 110. Then, the method 100 can include transmitting a self-test failure report to the at least one of the one or more notification devices 28, as in 112, and waiting for another test triggering event, as in 108.

It is to be understood that each of the self-test monitoring device 22, the sensors 26, and the one or more notification devices 28 as disclosed herein can include a respective transceiver device and a respective memory device, each of which can be in communication with respective control circuitry, one or more respective programmable processors, and respective executable control software as would be understood by one of ordinary skill in the art. In some embodiments, the respective executable control software of each of the self-test monitoring device 22, the sensors 26, and the one or more notification devices 28 can be stored on a respective transitory or non-transitory computer readable medium, including, but not limited to local computer memory, RAM, optical storage media, magnetic storage media, flash memory, and the like, and some or all of the respective control circuitry, the respective programmable processors, and the respective executable control software of each of the self-test monitoring device 22, the sensors 26, and the one or more notification devices 28 can execute and control at least some of the methods described herein.

Although a few embodiments have been described in detail above, other modifications are possible. For example, the logic flows described above do not require the particular order described or sequential order to achieve desirable results. Other steps may be provided, steps may be eliminated from the described flows, and other components may be added to or removed from the described systems. Other embodiments may be within the scope of the invention.

From the foregoing, it will be observed that numerous variations and modifications may be effected without departing from the spirit and scope of the invention. It is to be understood that no limitation with respect to the specific system or method described herein is intended or should be inferred. It is, of course, intended to cover all such modifications as fall within the spirit and scope of the invention.

What is claimed is:

1. A method comprising:
   receiving user input identifying a preplanned absence of a user of a security system from a region;
   identifying a test triggering event associated with the region, wherein the test triggering event includes a non-emergency type comprising receipt of the user input identifying the preplanned absence and an emergency type comprising a notification of an alert condition;
   responsive to identifying the test triggering event, activating a first self-test device of a first sensor of the security system that monitors the region;
   determining whether the first sensor passes or fails a first self-test associated the first self-test device;
   identifying a remaining battery life of the first sensor from results of the first self-test and determining that the first sensor fails the first self-test when the remaining battery life of the first sensor is less than a length of the preplanned absence;
   when the first sensor fails the first self-test and the type of test triggering event is identified as the non-emergency type comprising receipt of the user input identifying the preplanned absence, identifying a user device associated with the user of the security system as the one or more notification devices;
   when the first sensor fails the first self-test and the type of test triggering event is identified as the emergency type comprising the notification of the alert condition, identifying at least one third party device associated with local authorities or a system provider of the security system as the one or more notification devices; and
   transmitting a first self-test failure report to the one or more notification devices.

2. The method of claim 1 further comprising:
   identifying the remaining battery life of the first sensor in the first self-test failure report.

3. The method of claim 1 further comprising:
   using the first self-test to determine whether the first sensor is operable to detect threats in the region.

4. The method of claim 1 further comprising:
   receiving a notification of an emergency condition proximate to the region;
   identifying the notification of the emergency condition as the test triggering event;
   identifying the type of the test triggering event to be the emergency type; and when the first sensor fails the first self-test, identifying both a user device associated with a user of the security system and the at least one third party device associated with local authorities or the system provider of the security system as the one or more notification devices.

5. The method of claim 4 wherein the emergency condition includes an increase in crime in an area proximate to the region.

6. The method of claim 4 wherein the emergency condition includes a natural disaster in an area proximate to the region.

7. The method of claim 1 further comprising:
responsive to identifying the test triggering event, activating a second self-test device of a second sensor of the security system, wherein the second sensor is a different type than the first sensor;
determining whether the second sensor passes or fails a second self-test associated with the second self-test device;
when the second sensor fails the second self-test, identifying the one or more notification devices based on the type of the test triggering event; and
transmitting a second self-test failure report to the one or more notification devices.

8. A system comprising:
a self-test monitoring device;
a first sensor of a security system that monitors a region; and
one or more notification devices,
wherein the self-test monitoring device receives user input identifying a preplanned absence of a user of the security system from the region, and wherein the self-test monitoring device identifies a test triggering event, wherein the test triggering event includes a non-emergency type comprising receipt of the user input identifying the preplanned absence and an emergency type comprising a notification of an alert condition,
wherein, responsive to identifying the test triggering event, the self-test monitoring device activates a first self-test device of the first sensor and determines whether the first sensor passes or fails a first self-test associated with the first self-test device,
wherein the self-test monitoring device identifies a remaining battery life of the first sensor from results of the first self-test and determines that the first sensor fails the first self-test when the remaining battery life of the first sensor is less than a length of the preplanned absence,
wherein, when the first sensor fails the first self-test and the type of test triggering event is identified as the non-emergency type comprising receipt of the user input identifying the preplanned absence, identifying a user device associated with the user of the security system as the one or more notification devices,
wherein, when the first sensor fails to first self-test and the type of test triggering event is identified as aft the emergency type comprising the notification of the alert condition, identifying at least one third party device associated with local authorities or a system provider of the security system as the one or more notification devices, and
wherein the self-test monitoring device transmits a first self-test failure report to the one or more notification devices.

9. The system of claim 8 wherein the self-test monitoring device includes an indication of the remaining battery life of the first sensor in the first self-test failure report.

10. The system of claim 8 wherein the self-test monitoring device uses the first self-test to determine whether the first sensor is operable to detect threats in the region.

11. The system of claim 8 wherein the self-test monitoring device receives a notification of an emergency condition proximate to the region and, responsive thereto, identifies the notification of the emergency condition as the test triggering event and identifies the type of the test triggering event to be the emergency type, and
wherein, when the first sensor fails the first self-test, the self-test monitoring device identifies both the user device associated with a user of the security system and at least the one third party device associated with local authorities or the system provider of the security system as the one or more notification devices.

12. The system of claim 11 wherein the emergency condition includes an increase in crime in an area proximate to the region.

13. The system of claim 11 wherein the emergency condition includes a natural disaster in an area proximate to the region.

14. The system of claim 8 wherein, responsive to identifying the test triggering event, the self-test monitoring device activates a second self-test device of a second sensor of the security system and determines whether the second sensor passes or fails a second self-test associated with the second self-test device,
wherein the second sensor is a different type than the first sensor, and
wherein, when the second sensor fails the second self-test, the self-test monitoring device identifies the one or more notification devices based on the type of the test triggering event and transmits a second self-test failure report to the one or more notification devices.

* * * * *